United States Patent [19]
Hirao et al.

[11] Patent Number: 5,621,247
[45] Date of Patent: Apr. 15, 1997

[54] MEMORY DEVICE WITH TUNGSTEN AND ALUMINUM INTERCONNECTS

[75] Inventors: Shuji Hirao; Hideko Okada; Kousaku Yano, all of Osaka, Japan

[73] Assignee: Matsushita Electric Industrial Co., Ltd., Osaka, Japan

[21] Appl. No.: 602,285

[22] Filed: Feb. 16, 1996

[30] Foreign Application Priority Data

Feb. 20, 1995 [JP] Japan ................... 7-031248

[51] Int. Cl.⁶ .................... H01L 23/48; H01L 23/52; H01L 29/40
[52] U.S. Cl. .................... 257/763; 257/764; 257/765; 257/774
[58] Field of Search ................... 257/734, 763, 257/764, 765, 767, 774, 775

[56] References Cited

U.S. PATENT DOCUMENTS

| | | |
|---|---|---|
| 4,255,210 | 3/1981 | Okuyama et al. . |
| 4,822,753 | 4/1989 | Pintchovski et al. ............. 257/763 |
| 5,075,249 | 12/1991 | Sato et al. . |
| 5,177,589 | 1/1993 | Kobayashi et al. ............. 257/763 |
| 5,278,784 | 1/1994 | Ishihara et al. . |
| 5,341,026 | 8/1994 | Harada et al. ............. 257/764 |

FOREIGN PATENT DOCUMENTS

| | | |
|---|---|---|
| 5-128883 | 5/1993 | Japan . |
| 6-60684 | 3/1994 | Japan . |

*Primary Examiner*—Carl Whitehead, Jr.
*Attorney, Agent, or Firm*—McDermott, Will & Emery

[57] ABSTRACT

On an insulating substrate are formed first aluminum interconnections. In openings formed in a silicon dioxide film are formed unit cells each consisting of a tungsten electrode and an aluminum alloy electrode containing silicon. Over the silicon dioxide film are formed a large number of linear second aluminum interconnections which are orthogonal to the first aluminum interconnections. At the individual intersections of the first and second aluminum interconnections are disposed the unit cells so as to compose a memory cell array. When a large current is allowed to flow through the unit cell, silicon in the aluminum alloy electrode moves in a direction opposite to the current flow and is precipitated in the aluminum electrode in the vicinity of the interface with the tungsten electrode, resulting in an increase in resistance value. When a large current is allowed to flow through the unit cell in the opposite direction, silicon is diffused, resulting in a reduction in resistance value. Data can be read by measuring the magnitude of the resistance value with an extremely small current and judging whether it is in a high state or in a low state.

15 Claims, 13 Drawing Sheets

CURRENT FLOW

CURRENT FLOW

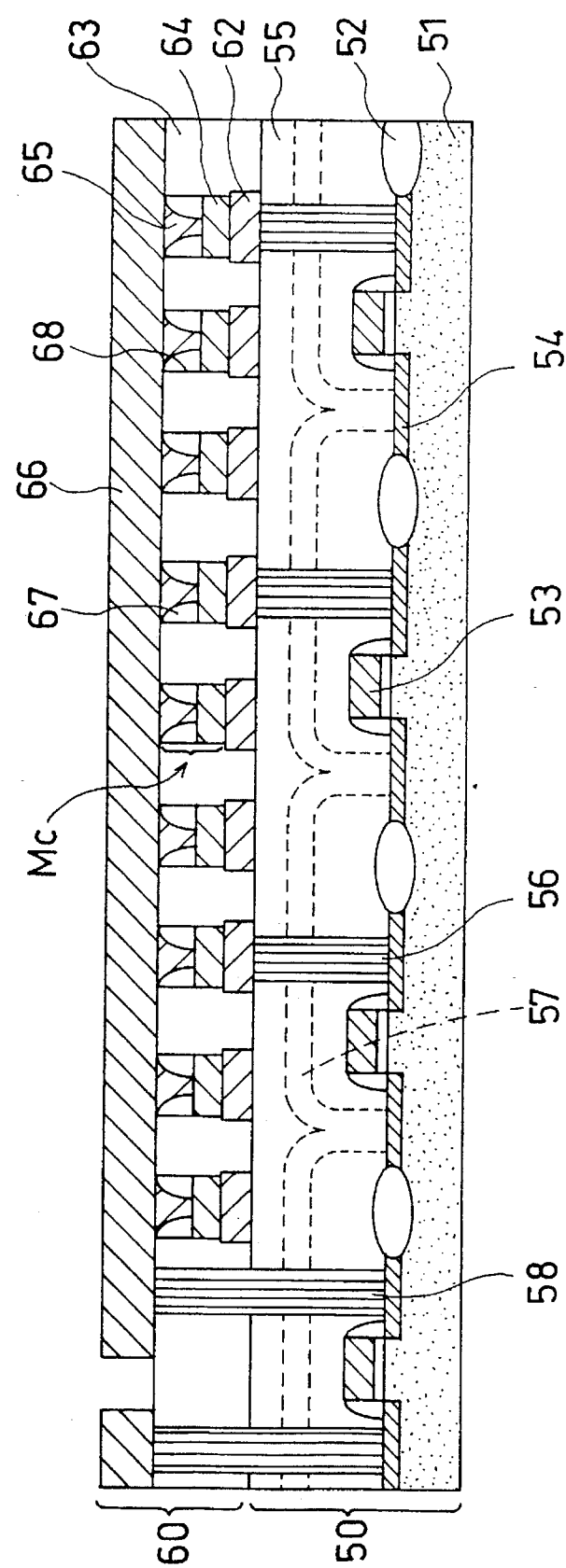

MEMORY CELL

CELL SELECT/DRIVE CIRCUIT

MEMORY CELL

PERIPHERAL CIRCUIT SUCH AS CELL SELECT/DRIVE CIRCUIT

MEMORY DEVICE WITH TUNGSTEN AND ALUMINUM INTERCONNECTS

BACKGROUND OF THE INVENTION

The present invention relates to a memory device utilizing variations in resistance value which can be used not only as an external memory device for a computer or the like but also as an internal memory device incorporated in a ULSI and to a method of manufacturing the same.

With recent remarkable improvements in the performance of a processor or the like composed of a ULSI to be contained in a computer, an external memory device having a high capacity has been in increasing demand. To compose the high-capacity external memory device, such devices as a magnetic disk, a CD-ROM, and an IC memory device using a silicon semiconductor have commonly been used.

Among them, a non-volatile memory using fuses as disclosed in U.S. Pat. No. 5,278,784 has particularly been known. FIG. 13 shows a memory cell array disclosed in the above publication, which consists of a large number of memory cells arranged to form a matrix. The individual memory cells are connected by a word line 100 and bit lines 101a to 101c along rows and a column. In the drawing are shown: select transistors 106a to 106c which have their gates connected to the above word line 100; auxiliary transistors 105a and 105b which connect contiguous memory cells; a common source line 103 connected to each of the sources of the above select transistors 106a to 106c. Between the memory cells and the bit lines 101a to 101c are interposed respective fuses 104a to 104c each of which functions as a non-volatile memory cell. Any one of the fuses 104a to 104c is melted down by allowing a large current to flow therethrough. If the disconnected state and connected state of the fuses 104a to 104c are defined as "1" and "0", respectively, the fuses 104a to 104c can be utilized as non-volatile memory (ROM) cells.

However, the conventional magnetic disk, CD-ROM, and non-volatile memory such as a ROM using fuses have the following drawbacks.

Although the magnetic disk or CD-ROM can be designed to have a larger capacity, access time is also increased. Consequently, even if the performance of a computer is to be increased by increasing the capacity of such a memory, the computer cannot fully achieve its intrinsic performance. Consequently, an external memory device has presented an obstacle to improved performance of the computer.

On the other hand, although an IC memory device and the foregoing ROM using fuses can be accessed at substantially the same speed as a ULSI, chip size is also increased with increases in capacity, so that manufacturing cost is increased, resulting in extremely high price.

Moreover, since it is structurally impossible to rewrite to these non-volatile memories, they only have limited applications. For example, a non-volatile memory cannot be used as a RAM.

SUMMARY OF THE INVENTION

The present invention has been achieved by focusing attention on a phenomenon caused by a current allowed to flow between two films composed of different types of conductive materials, particularly on the phenomenon that resistance varies when constituent atoms of the conductive materials move under the influence of the current, which has conventionally been considered unfavorable. It is therefore an object of the present invention to provide a novel memory device which utilizes the phenomenon of the varying resistance in order to perform a storing function and hence has applications as a variety of memories.

A first memory device of the present invention comprises: a first conductive member; a second conductive member provided to be opposed to the above first conductive member; and a resistance varying member interposed between the above first conductive member and the above second conductive member, the above resistance varying member having a resistance varying characteristic such that its resistance varies due to a movement of atoms which occurs when a current equal to or higher than a specified value is allowed to flow therethrough and a function of retaining a high-resistance state and a low-resistance state as data. The above data can be written in the above resistance varying member by allowing a first current equal to or higher than the above specified value to flow through the above resistance varying member and the above data can be read from the above resistance varying member by allowing a second current lower than the above specified value to flow through the above resistance varying member.

The structure enables the writing, reading, and erasing of data utilizing the resistance varying member having the function of retaining data, while the data is non-volatile. Moreover, since the resistance varying member is simple in structure, it can be formed in an extremely small area. Consequently, if each resistance varying member is used as a unit cell, it becomes possible to construct a high-density non-volatile memory wherein data can be written, read, and erased in and from each individual unit cell. Hence, even when the memory device is increased in integration, its access time is not increased so that the memory device enables a computer for which it is used as an external memory to fully achieve its performance.

In the above first memory device, the above resistance varying member may be composed of a material having the resistance varying characteristic such that its resistance varies as a result of the formation of a void in the vicinity of an end portion thereof due to the movement of the constituent atoms which is caused by the current equal to or higher than the above specified value.

Alternatively, the above resistance varying member may be composed of substantially pure aluminum.

The above first conductive member and the above second conductive member may be stacked in layers via an interlayer insulating film, the above interlayer insulating film may be formed with an opening connecting the above first and second conductive members with each other, and the above resistance varying member may be an aluminum electrode stacked in layers in conjunction with a tungsten electrode in the above opening.

The structures enable the writing and reading of data utilizing the resistance varying characteristic such that the resistance varies due to the formation of a void in the vicinity of the end portion of the resistance varying member. Consequently, if each resistance varying member is used as a unit cell, there can be implemented a non-volatile memory device wherein data can be written and erased in and from each individual unit cell.

In the above memory device, a contact area between the above aluminum electrode and the above tungsten electrode is preferably smaller than a contact area between the above aluminum electrode and the above first or second conductive member.

The structure increases the current density at that one of the both ends of the resistance varying member which has a smaller contact area, so that the time required to form a void in the end portion can be reduced by intentionally allowing a current to flow therethrough. As a result, the time required to write data is reduced, which increases the practicality of the memory device.

The above data written in the above resistance varying member can be erased therefrom by switching the high-resistance or low-resistance state of the above resistance varying member to the opposite state by allowing a third current equal to or higher than the above specified value to flow in a direction opposite to the flow of the above first current through the above resistance varying member via the above first and second conductive members.

The structure also enables the erasing, i.e., rewriting of data utilizing the removement of atoms.

The above resistance varying member may be composed of a main material and an impurity and have the resistance varying characteristic such that its resistance varies due to the movement of the impurity in the above main material which is caused by the current equal to or higher than the above specified value.

Alternatively, the above main material may be aluminum and the above aluminum may contain 0.5% to 20% of silicon as the above impurity.

The above first conductive member and the above second conductive member may be stacked in layers via an interlayer insulating film, the above interlayer insulating film may be formed with an opening connecting the above first and second conductive members with each other, and the above resistance varying member may be an aluminum alloy electrode stacked in layers in conjunction with a tungsten electrode in the above opening.

With the structures, the resistance becomes high when impurity ions are moved by a current equal to or higher than a specified value and precipitated at one end of the resistance varying member, while it becomes low when the impurity ions precipitated at the end of the resistance varying member are diffused by a current flowing in the opposite direction. Consequently, if each resistance varying member is used as a unit cell utilizing variations in resistance value due to the movement of the impurity atoms, there can be implemented a non-volatile memory device wherein data can be written, read, and erased in and from each individual cell, i.e., rewritten therein.

In this case, a contact area between the above aluminum alloy electrode and the above tungsten electrode may be smaller than a contact area between the above aluminum alloy electrode and the above first or second conductive member.

The structure increases the current density at that one of the both ends of the resistance varying member which has a smaller contact area, so that the time required to form a void at the end portion can be reduced by allowing a current to flow therethrough. As a result, the time required to write data and the time required to erase data is reduced, which increases the practicality of the memory device.

A second memory device of the present invention is obtained in such a manner that, in the above first memory device, the above first conductive member is composed of a plurality of first interconnections extending in parallel to each other, the above second conductive member is composed of a plurality of second interconnections extending in a direction orthogonal to the above respective first interconnections, and the above resistance varying member is disposed at each of the intersections of the above first interconnections and the above second interconnections.

The structure enables the resistance varying members of the memory device to be accommodated at high density in an extremely small area, so that the cost and size of the memory device can be reduced.

The second memory device may further comprise: a plurality of MOS transistors each consisting of a semiconductor substrate, a gate electrode, a source region, and a drain region; and a plurality of bit lines connected to the source regions of the above respective MOS transistors, wherein the above first conductive members are impurity diffusion layers formed by introducing an impurity into a plurality of linear regions of the above semiconductor substrate, which has been partitioned by a plurality of isolating insulating films, and having their surfaces silicidized and the above first conductive members are connected to the drain regions of the above respective MOS transistors so that data can be written and read in and from that one of the resistance varying members selected via the above gate electrode and the above bit line of each of the above MOS transistors.

In the above second memory device, the above data written in the above resistance varying member can be erased therefrom by switching the high-resistance or low-resistance state of the above resistance varying member to the opposite state by allowing a third current equal to or higher than the above specified value to flow in a direction opposite to the flow of the above first current through the above resistance varying member via the above first and second conductive members and the data can be erased from the resistance varying member which has been selected via the above gate electrode and the above bit line of each of the above MOS transistors and in which the data has been written.

The structure enables a memory unit composed of the resistance varying members as the unit cells and a peripheral circuit unit containing the MOS transistors as the select transistors to be mounted on the same semiconductor substrate. In this case, since the structure of the memory device can be implemented by using a typical salicide process for MOS transistors, there can be obtained a memory device which is high in overall integration and functions as a PROM or RAM manufactured at extremely low cost.

The second memory device may further comprise: a plurality of MOS transistors each consisting of a semiconductor substrate, a gate electrode, a source region, and a drain region; and a plurality of bit lines connected to the source regions of the above respective MOS transistors. The above first conductive members are formed over the above respective MOS transistors via insulating films and the above resistance varying members are connected to the drain regions of the above respective MOS transistors via contacts formed in the above insulating films so that data can be written and read in and from that one of the resistance varying members selected via the above gate electrode and the above bit line of each of the above MOS transistors.

The above data written in the above resistance varying member can be erased therefrom by switching the high-resistance or low-resistance state of the above resistance varying member to the opposite state by allowing a third current equal to or higher than the above specified value to flow in a direction opposite to the flow of the above first current through the above resistance varying member via the above first and second conductive members and the data can be erased from the resistance varying member which has been selected via the above gate electrode and the above bit line of each of the above MOS transistors and in which the data has been written.

The structure enables the memory unit composed of the resistance varying members as the unit cells and the peripheral circuit unit containing the MOS transistors as the select transistors to be three-dimensionally accommodated in the same portion of the semiconductor substrate, so that a memory device which is extremely high in integration and functions as a PROM or RAM can be obtained.

A method of manufacturing a memory device according to the present invention comprises: a first step of forming, on a substrate, a plurality of first conductive members extending in parallel to each other; a second step of forming, over the above first conductive members and the above substrate, an interlayer insulating film; a third step of forming, in the above interlayer insulating film, a plurality of openings leading to the above respective first conductive members; a fourth step of forming, in each of the above respective openings, a resistance varying member having a resistance varying characteristic such that its resistance varies due to the movement of atoms which occurs when a current equal to or higher than a specified value is allowed to flow therethrough; and a fifth step of forming, over the above interlayer insulating film, a plurality of second conductive members connected to the above respective resistance varying members and extending in a direction orthogonal to the above respective first conductive members.

By the method, there can easily be formed a high-integration memory device wherein each resistance varying member is used as a unit cell and data can be read and written from and in each individual unit cell.

In the above method of manufacturing a memory device, in the above fourth step, a first metal electrode and a second metal electrode may be stacked in layers and either one of the above first and second metal electrodes may be the above resistance varying member.

By the method, one of the first and second metal electrodes serves as the resistance varying member, while the other does not serve as the resistance varying member. If the material and thickness of the metal electrode not serving as the resistance varying member are properly selected and determined, a void or atoms can easily and positively be formed or precipitated, respectively, in the metal electrode serving as the resistance varying member in the vicinity of the interface with the metal electrode not serving as the resistance varying electrode when the atoms are moved by a current, while the capacitance between the conductive members can be reduced, resulting in the formation of a memory device with high performance.

In the above memory device, in the above fourth step, the above first metal electrode may be deposited, an insulating film may be deposited over the entire surface of the substrate, the above insulating film may be etched back to form sidewalls on side faces of the openings while the above first metal electrode is partially exposed, and the above second metal electrode may be formed over that portion of the above first electrode which has been exposed.

In the above method of manufacturing a memory device, in the above second step, a first interlayer insulating film and a second interlayer insulating film may be separately formed, in the above third step, first openings and second openings may be separately formed, and in the above fourth step the first metal electrodes and the second metal electrodes may be separately formed, wherein the first interlayer insulating film may be formed over the above first conductive members and the above substrate, the plurality of first openings leading to the above respective first conductive members may be formed in the above first interlayer insulating film, and the above first openings may be filled with the first metal electrodes, the second interlayer insulating film may be formed over the above first interlayer insulating film, the second openings may be formed in the above second interlayer insulating film, the above second openings being shifted in position from the above respective first openings such that the above first metal electrodes are partially exposed, the above second openings may be filled with the second metal electrodes to be connected to the above first metal electrodes, and in the above fifth step, the plurality of second conductive members may be formed over the above interlayer insulating film to be connected to the above second metal electrodes and extend in a direction orthogonal to the above first conductive members.

By the method, the contact area between the first metal electrode and the second metal electrode is reduced, so that there can be formed a memory device which is practically advantageous in that the resistance of the resistance varying member can be varied promptly by forming a void or precipitating atoms in the interface having a small contact area when the atoms are moved.

In the above method of manufacturing a memory device, in the above first step, the semiconductor substrate may be divided into a plurality of regions by a plurality of isolating insulating films, impurity diffused layers may be formed by introducing an impurity into the regions of the above semiconductor substrate which are located between the above adjacent isolating insulating films, and the above impurity diffused layers may have their surfaces silicidized.

The method enables the memory unit composed of the resistance varying members as the unit cells and the peripheral circuit unit containing the MOS transistors as the select transistors to be formed on the same semiconductor substrate through a typical salicide process. As a result, the memory device can be manufactured at lower cost.

The above method of manufacturing a memory device further comprises: prior to the above first step, the step of forming, on a semiconductor substrate, MOS transistors each consisting of a gate electrode, a source region, and a drain region; the step of forming a plurality of bit lines to be connected to the source regions of the above respective MOS transistors; and the step of depositing, over the above MOS transistors and the above semiconductor substrate, an insulating film, wherein in the above first step, the first conductive members are formed on the above insulating film forming the above substrate, the above method further comprising the step of forming contact members for connecting the above first conductive members to the drain regions of the above respective MOS transistors.

The method enables the peripheral circuit unit containing the MOS transistors as the select transistors and the memory unit composed of the resistance varying members as the unit cells to be formed three-dimensionally on the semiconductor substrate. Consequently, there can be implemented a memory device which is extremely high in integration.

BRIEF DESCRIPTION OF THE DRAWINGS

FIG. 9 is a cross-sectional view of a semiconductor integrated circuit according to a fifth embodiment;

DETAILED DESCRIPTION OF THE INVENTION (First Embodiment)

Initially, a first embodiment will be described with reference to FIG. 1, FIGS. 2(a) and 2(b), and FIG. 3.

Figure 1:
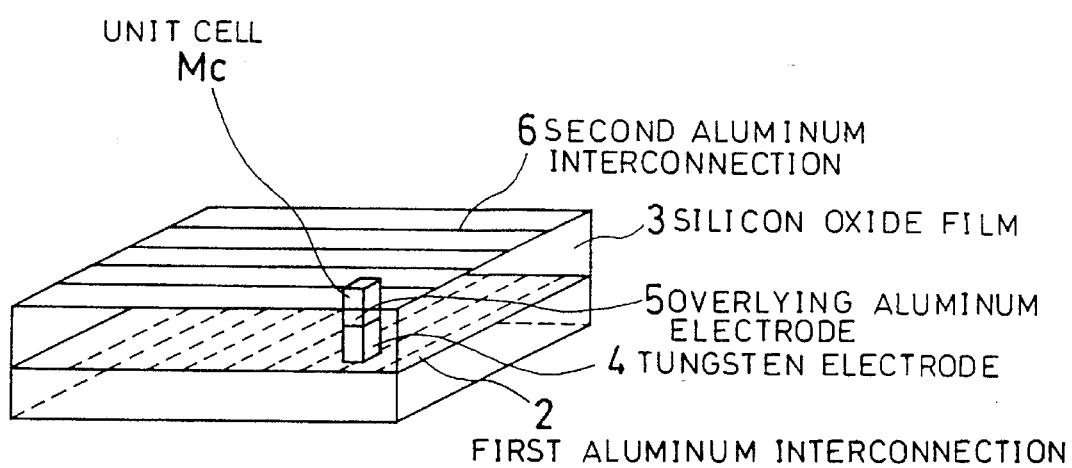
FIG. 1 is a perspective view schematically showing the structure of a memory device according to a first embodiment.
Figure 2A:
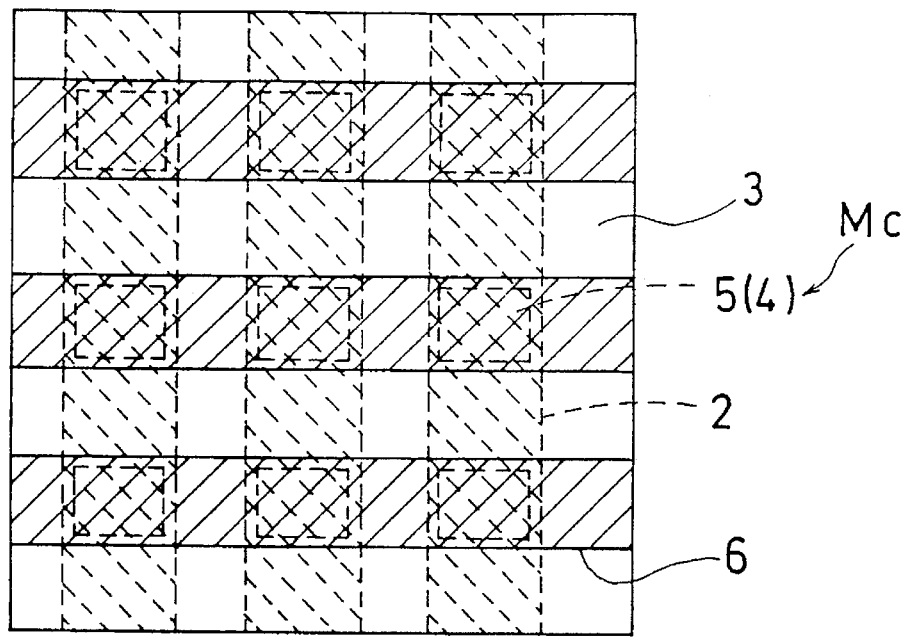
FIG. 2(a) is a plan view of the memory device according to the first embodiment and FIG. 2(b) is a cross-sectional view thereof.

FIG. 1 is a perspective view of a memory device according to the first embodiment. FIG. 2(a) is a plan view of the memory device and FIG. 2(b) is a cross-sectional view thereof.

On an insulating substrate 1 made of alumina or glass has been provided first aluminum interconnections 2 each serving as a first conductive member. The first aluminum interconnections 2 are composed of a large number of fine lines each having a thickness of about 500 nm and a width of 500 nm. The fine lines composing the first aluminum interconnections 2 are arranged in parallel with a pitch of 1 μm or less. On the first aluminum interconnections 2 on the insulating substrate 1 has been deposited a silicon dioxide film 3 serving as an interlayer insulating film and having a thickness of about 1000 nm. On the silicon dioxide film 3 have been formed second aluminum interconnections 6 each serving as a second conductive member. The second aluminum interconnections 6 are composed of a large number of fine lines each having substantially the same thickness and width as the above first aluminum interconnection 2. The fine lines composing the second aluminum interconnections 6 have substantially the same pitch as the first aluminum interconnections 2 and extend in the direction orthogonal to the first aluminum interconnections 2. At each of the intersections of the first aluminum interconnections 2 and the second aluminum interconnections 6 on the plane shown in FIG. 2(a) is disposed a unit cell Mc serving as a varying resistance member. The unit cell Mc is constituted by a multilayer film consisting of a tungsten electrode 4 and an overlying aluminum electrode 5, which have sequentially been deposited in an opening 8 formed in the silicon dioxide film Each of the tungsten electrode 4 and overlying aluminum electrode 5 has a thickness of about 400 nm. The above aluminum electrode 5 has a composition substantially similar to that of pure aluminum. Each of the first and second aluminum interconnections 2 and 6 contains about 0.5% of silicon.

Figure 2B:
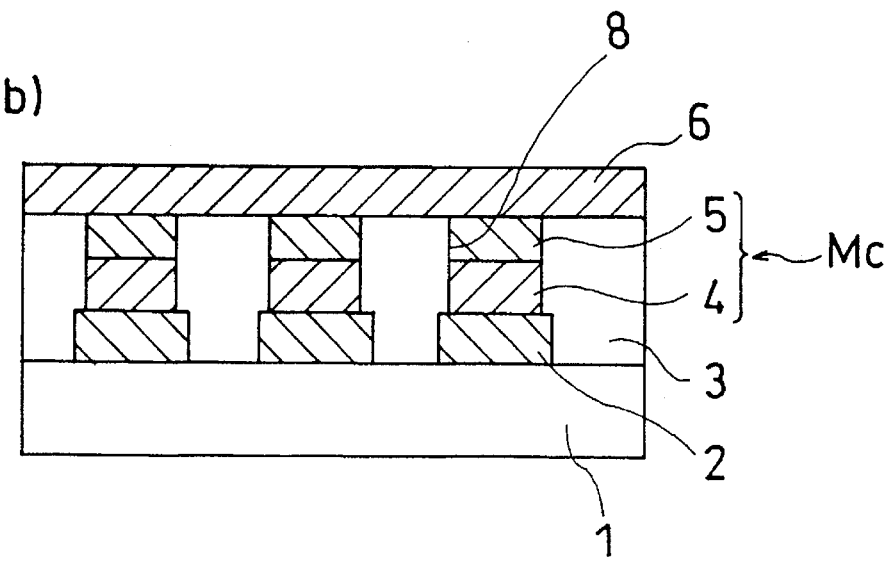

Although each of the first and second aluminum interconnections 2 and 6 is simply represented by lines in FIG. 1 for the sake of clarity, it actually has a given width and a given thickness, as shown in FIGS. 2(a) and 2(b).

The memory device according to the present embodiment can be fabricated by utilizing such existing technology as described below, though the drawing of the fabrication process is omitted here. Initially, an aluminum film having a thickness of 500 nm is formed by sputtering on the insulating substrate 1, followed by the formation of the first aluminum interconnections 2 by photolithography and dry etching. Subsequently, the silicon dioxide film 3 having a thickness of about 1000 nm is deposited by, e.g., plasma CVD over the entire surface of the substrate, followed by planarization. On the planarized silicon dioxide film 3 is formed a photoresist mask having numerous openings corresponding to the individual intersections of the first aluminum interconnections 2 and the second aluminum interconnections 6. Dry etching is then performed using the photoresist mask so that the openings 8 leading to the first aluminum interconnections 2 are formed in the silicon dioxide film 3. After the photoresist mask is removed, tungsten and aluminum are sequentially deposited on the first aluminum interconnection 2 in each of the openings 8 by selective CVD, thus forming the tungsten electrode 4 and the aluminum electrode 5 each having a thickness of about 400 nm. Thereafter, an aluminum film having a thickness of about 500 nm is formed by sputtering over the entire surface of the substrate, followed by the formation of the second aluminum interconnections 6 by photolithography and dry etching.

Figure 3:
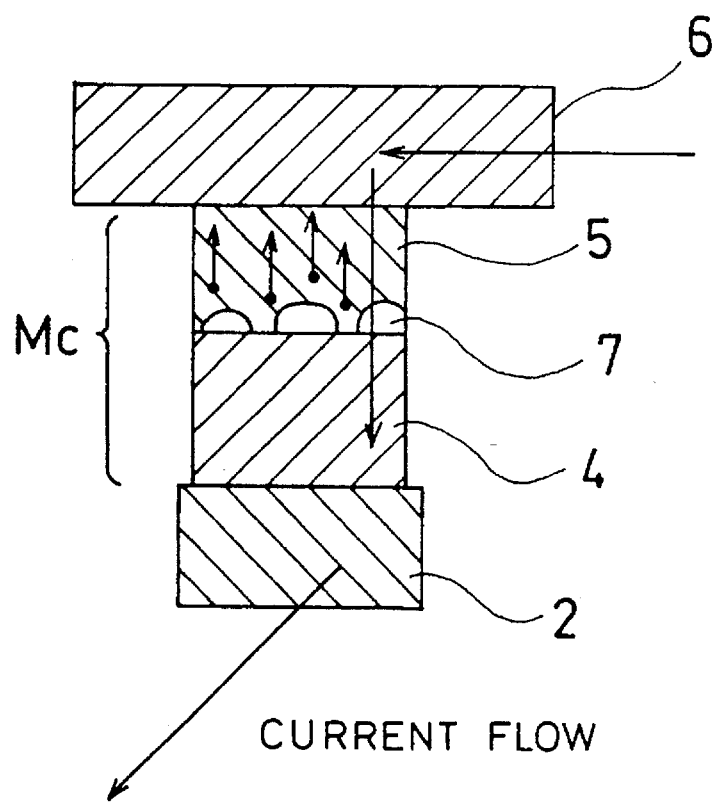
FIG. 3 is a cross-sectional view illustrating the principle of writing data in a unit cell portion of the memory device according to the first embodiment.

FIG. 3 is an enlarged cross-sectional view showing only one unit cell Mc. There has been known the phenomenon that, when a current is allowed to flow in the direction indicated by the arrow in the drawing by application of a low voltage and a high voltage to the first aluminum interconnection 2 and to the second aluminum interconnection 6, respectively, aluminum atoms move in the direction opposite to the current flow. The phenomenon is termed electromigration and generally considered unfavorable since it lowers the reliability of a semiconductor device.

Here, the present embodiment focuses attention on the fact that the resistance value is increased by the movement of the aluminum atoms. If a current on the order of $1 \times 10^6$ A/cm$^2$ is allowed to flow through the unit cell Mc, the aluminum atoms move in the direction opposite to the current flow, so that voids 7 are formed in the aluminum electrode 5 in the vicinity of the interface with the tungsten electrode, which drastically increases the resistance of the unit cell Mc. If the state in which the resistance value has been increased by the formation of the voids 7 is defined as data "1" (or "0"), while the state in which the resistance value remains low with no void 7 formed is defined as "0" (or "1"), the unit cell Mc can be utilized as a memory cell. By using a sufficiently small current equal to or less than $0.5 \times 10^5$ A/cm$^2$ in reading the data therefrom, it can be judged whether the resistance of each unit cell Mc is in the high state or in the low state without adversely affecting data retention.

In the reading operation, the resistance of the unit cell Mc may vary due to a data read current. However, if a sufficient difference (ratio) is provided between a data write current and the data read current (e.g., 100 to 1000 times or more), variations in resistance value as a result of the reading operation can be avoided. In the case where the resistance value may vary during the reading operation for such a reason that the difference between the data write current and the data read current cannot be increased sufficiently, problems could be avoided by adding to the memory device such a refreshing function as performed in a DRAM. Moreover, even in the case where refreshing should be performed, stored data is retained if a power source is turned off, since it is non-volatile. Consequently, it is sufficient to perform refreshing when memory operation is unaffected (e.g., when the memory is not used or when another block in the memory is used). It is not necessary to perform refreshing simultaneously with reading, as is performed in a DRAM, so that the reading operation is not adversely affected.

The present embodiment has focused attention on the phenomenon of electromigration which is observed when a current is allowed to flow through the aluminum electrode 5 and has utilized such a characteristic that resistance increases due to voids formed in the aluminum electrode 5 as a result of the electromigration. Since the resulting high state of resistance is essentially non-volatile, as described above, it is retained even when the power source is turned off. Moreover, since the formation of the voids 7 can be considered to be an irreversible process and the writing of data is possible at any time, the memory device in the present embodiment functions as a PROM.

The speed at which the voids 7 are formed is dependent on temperature. The voids 7 are formed more promptly at a higher temperature. Accordingly, by heating the memory device to about 200° C. prior to the writing operation, writing time can be reduced.

(Second Embodiment)

Below, a second embodiment will be described with reference to FIGS. 4(a) to 4(d). FIGS. 4(a) to 4(d) are cross-sectional views illustrating the process of manufacturing a semiconductor memory device according to the present embodiment.

Figure 4A:
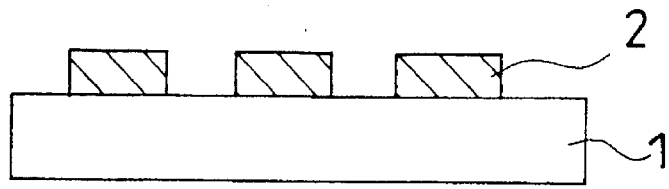
FIGS. 4(a) to 4(d) are cross-sectional views illustrating the process of manufacturing a memory device according to a second embodiment.

Initially, as shown in FIG. 4(a), the first aluminum interconnections 2 composed of a large number of fine lines are formed on the insulating substrate 1. The size and formation method of the aluminum interconnection 2 are the same as described in the above first embodiment.

Figure 4B:
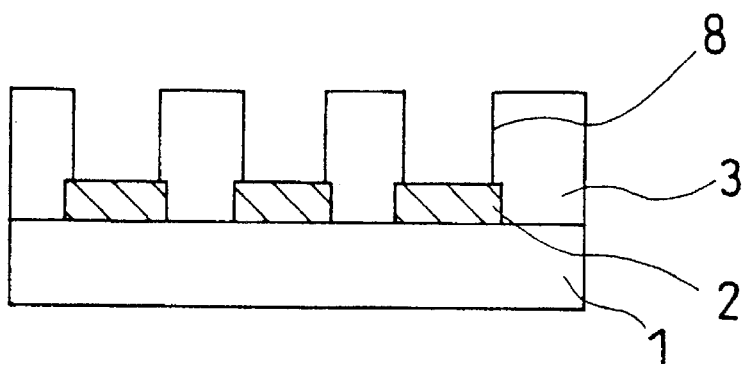

Next, as shown in FIG. 4(b), the silicon dioxide film 3 is formed over the entire surface of the substrate by the same method as used in the above first embodiment. Subsequently, the openings 8 leading to the first aluminum interconnections 2 are formed in the silicon dioxide film 3 by dry etching using a photoresist mask.

Figure 4C:
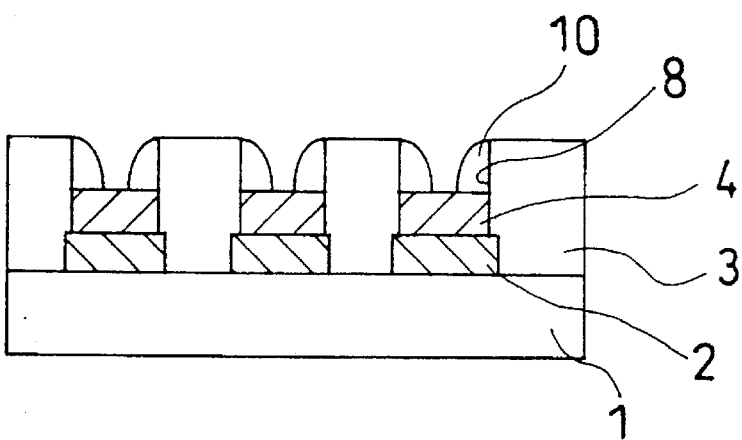

Next, as shown in FIG. 4(c), tungsten is deposited on the first aluminum interconnections 2 in the openings 8 by selective CVD, so as to form the tungsten electrodes 4 each having a thickness of about 200 nm. Thereafter, a silicon dioxide film is deposited over the entire surface of the substrate to a thickness corresponding to about ½ of the shortest side of the opening 8, followed by the formation of insulating sidewalls 10 on the side faces of the openings 8. At that stage, the tungsten electrodes 4 have partially been exposed.

Figure 4D:
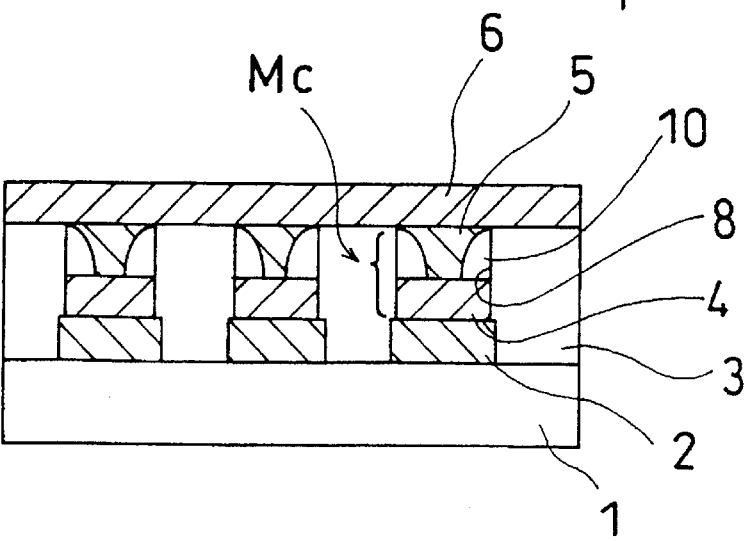

Next, as shown in FIG. 4(d), aluminum is deposited on these portions of the tungsten electrodes 4 which have been exposed by selective CVD, so as to form the aluminum electrodes 5 each having a thickness of 200 nm. Furthermore, the second aluminum interconnections 6 composed of a large number of fine lines to be connected to the respective aluminum electrodes 5 are formed, similarly to the above first embodiment. Finally, the above tungsten electrode 4 and the aluminum electrode 5 constitute the unit cell Mc, similarly to the above first embodiment.

In the present embodiment also, the resistance value can be increased by allowing the data write current to flow, similarly to the above first embodiment, so that data can be stored by utilizing the phenomenon.

Moreover, since the contact area between the tungsten electrode 4 and the aluminum electrode 5 is smaller than the contact area between the aluminum electrode 5 and the second aluminum interconnection 6 in the present embodiment, an effective current density at the contact portion of the tungsten electrode 4 and the aluminum electrode 5 is increased when the write current has flown. Consequently, the time required to form the voids in the aluminum electrode 5 can be reduced.

(Third Embodiment)

Below, a third embodiment will be described with reference to FIGS. 5(a) to 5(d) and to FIG. 6. FIGS. 5(a) to 5(d) are cross-sectional views illustrating the process of manufacturing a semiconductor memory device according to the present embodiment.

Figure 5A:
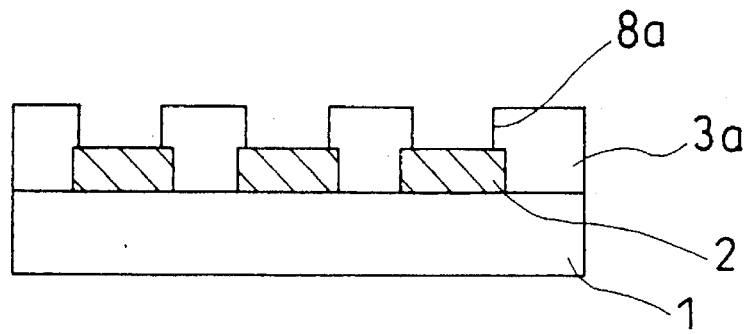
FIGS. 5(a) to 5(d) are cross-sectional views illustrating the process of manufacturing a memory device according to a third embodiment.

Initially, as shown in FIG. 5(a), the first aluminum interconnections 2 composed of a large number of fine lines are formed on the insulating substrate 1. The size and formation method of the aluminum interconnection 2 are the same as described in the above first embodiment. After a first silicon dioxide film 3a is further deposited to a thickness of about 20 nm over the entire surface of the substrate, first openings 8a leading to the first aluminum interconnections 2 are formed in the first dioxide film 3a by dry etching using the photoresist mask.

Figure 5B:
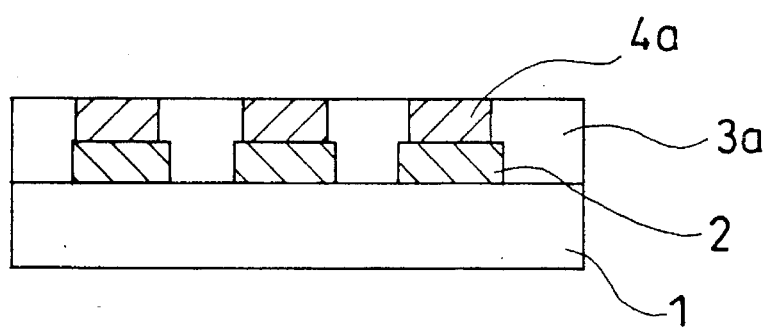

Next, as shown in FIG. 5(b), tungsten is deposited on the aluminum interconnections 2 in the first openings 8a by selective CVD, so as to form the tungsten electrodes 4 composed of tungsten filled in the first openings 8a.

Figure 5C:
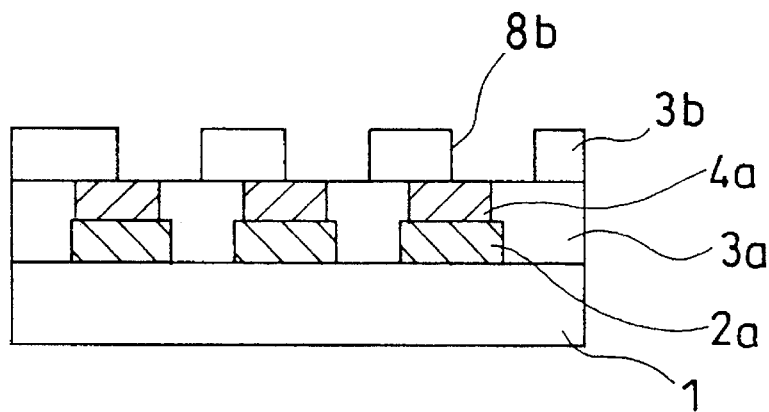

Next, as shown in FIG. 5(c), a second silicon dioxide film 3b is deposited to a thickness of about 200 nm over the entire surface of the substrate, followed by the formation of second openings 8b in the same manner as used to form the above first openings 8a. During the process, the present embodiment has shifted the second openings 8b in position from the first openings 8a, as shown in FIG. 6.

Figure 5D:
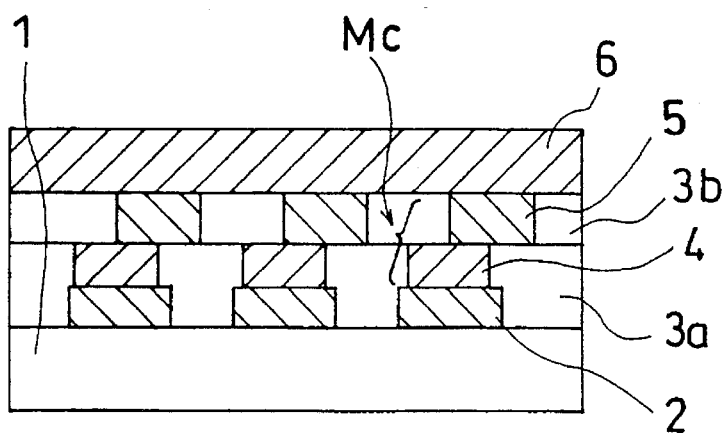

Next, as shown in FIG. 5(d), the aluminum electrodes 5 are formed in the second opening 8b, followed by the formation of the second aluminum interconnections 6 composed of a large number of fine lines to be connected to the respective aluminum electrodes 5 in the same manner as used in the above first embodiment. Finally, the above tungsten electrode 4 and the aluminum electrode 5 constitute the unit cell Mc, similarly to the above first embodiment.

In the present embodiment also, the resistance value can be increased by allowing the write current to flow, similarly to the above first embodiment, so that data can be stored by utilizing the phenomenon.

Figure 6:
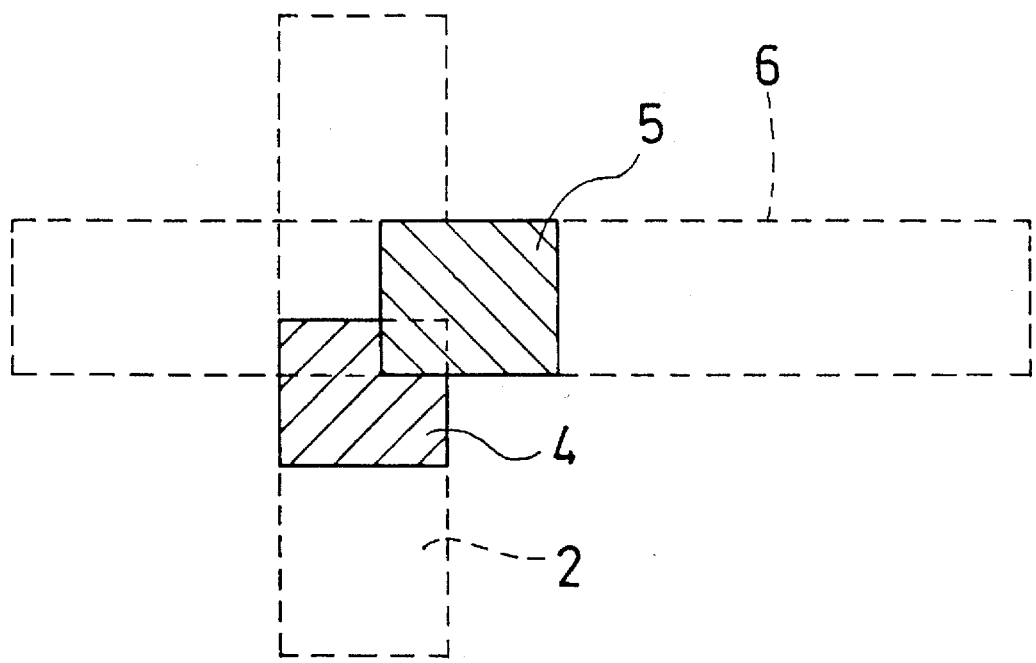
FIG. 6 is a plan view illustrating displacements of individual openings in the third embodiment.

Moreover, since the present embodiment has formed the tungsten electrode 4 and the aluminum electrode 5 such that they are shifted in position from each other and overlapping only partially, as shown in FIG. 6, the contact area between the aluminum electrode 5 and the tungsten electrode 4 is smaller than the contact area between the aluminum electrode 5 and the second aluminum interconnection 6. As a result, an effective current density at the contact portion of the tungsten electrode 4 and the aluminum electrode 5 is increased when the write current has flown, similarly to the above second embodiment. Consequently, the time required to form the voids in the aluminum electrode 5 can be reduced so that the same effect as achieved in the above second embodiment can be achieved.

(Fourth Embodiment)

Below, a description will be given to a fourth embodiment with respect to FIG. 7, FIGS. 8(a) and 8(b), and FIG. 9.

Figure 7:
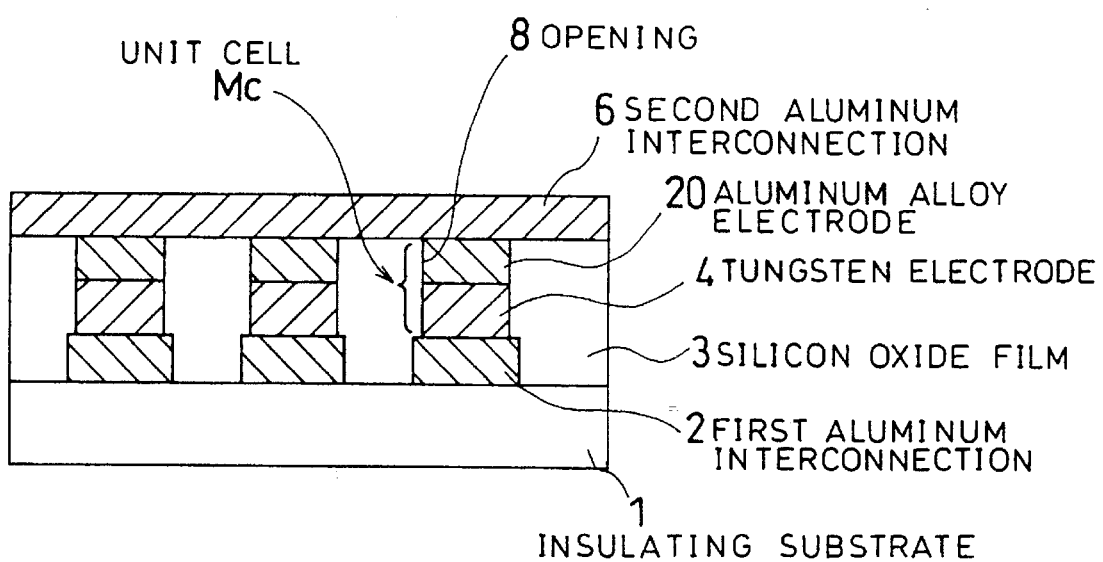
FIG. 7 is a cross-sectional view of a memory device according to a fourth embodiment.

FIG. 7 is a cross-sectional view showing the structure of a memory device according to the present embodiment. The structure of the memory device of the present embodiment is basically the same as that of the memory device of the above first embodiment so that the description of their common components is omitted here. In the present embodiment, there are provided aluminum alloy electrodes 20 containing about 0.5% to 20% of silicon, instead of the aluminum electrodes 5 according to the above first embodiment. Therefore, the tungsten electrode 4 and the aluminum alloy electrode 20 constitute the unit cell Mc having the function of storing data in the present embodiment.

In the formation of the aluminum alloy electrodes 20, if they contain about 0.5% of silicon, for example, the composition thereof can be the same as that of the overlying second aluminum interconnections 6, so that the aluminum alloy electrodes 20 and the second aluminum interconnections 6 can be formed simultaneously from an aluminum film, which has been deposited over the openings and the entire surface of the substrate by sputtering or like technique after the formation of the tungsten electrode 4, and patterned.

To form the aluminum alloy electrodes 20 which contain a large amount of silicon and hence is different in composition from the second aluminum interconnections 6, the following methods can be used. For example, pure aluminum may be deposited on the tungsten electrodes 4 by selective CVD so that silicon ions are implanted into the pure aluminum. Alternatively, an aluminum alloy film containing a large amount of silicon may be deposited not only over the tungsten electrodes 4 but also over the entire surface of the substrate by sputtering or like technique so that the aluminum alloy film is etched back by CMP or like technique till the silicon dioxide film becomes exposed and remains only in the openings. It will be appreciated that other well-known techniques used to form filled plugs can also be used in the present embodiment.

Figure 8A:
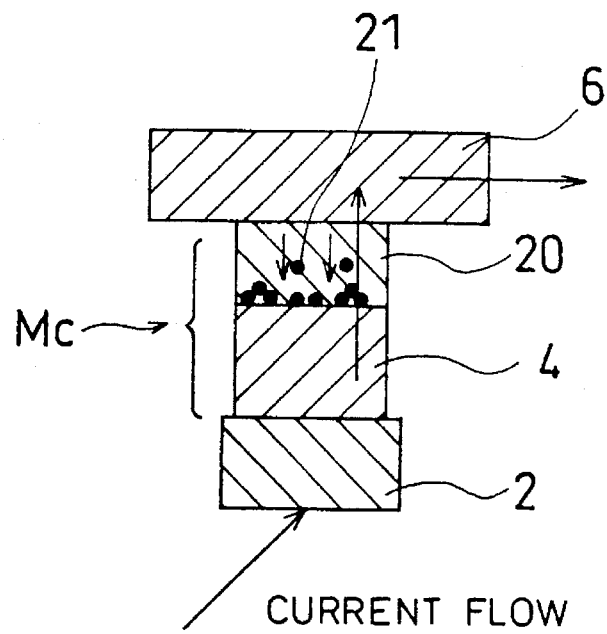
FIGS. 8(a) and 8(b) are cross-sectional views illustrating the principle of writing and erasing data in and from the unit cell portion of the memory device according to the fourth embodiment.

FIGS. 8 (a) and 8 (b) are enlarged cross-sectional views each showing the unit cell Mc portion. As shown in FIG. 8(a), if a current is allowed to flow in the direction indicated by the arrow in the drawing by application of a high voltage and a low voltage to the first aluminum interconnection 2 and to the second aluminum interconnection 6, respectively, silicon 21 in the aluminum alloy electrode 20 moves in the direction opposite to the current flow, so that the silicon 21 is precipitated in the aluminum alloy electrode 20 in the vicinity of the interface with the tungsten electrode 4. The precipitation of the silicon 21 drastically increases the resistance of the unit cell Mc, which indicates that data has been written, similarly to the above first embodiment.

Figure 8B:
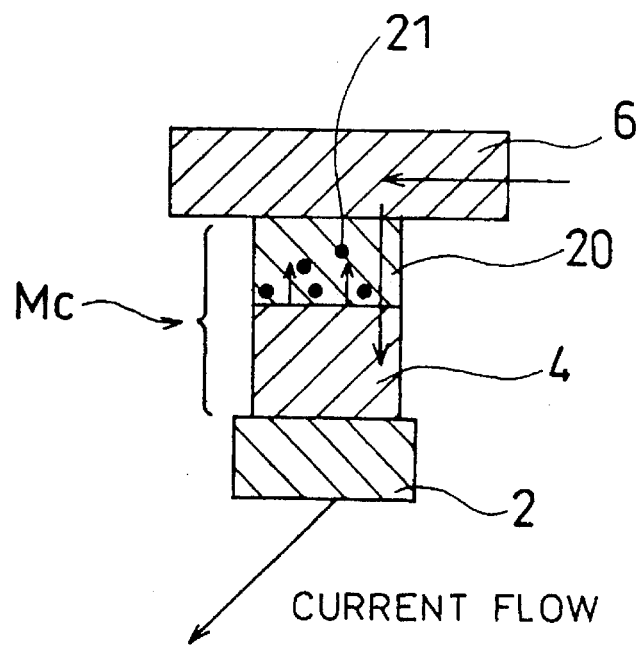

On the other hand, as shown in FIG. 8(b), if a current on the order of $1 \times 10^6$ A/cm$^2$, e.g., is allowed to flow in the direction indicated by the arrow in the drawing by application of a low voltage and a high voltage to the first aluminum interconnection 2 and to the second aluminum interconnection 6, respectively, in the memory device of FIG. 8(a), the silicon 21 in the aluminum alloy electrode 20 moves in the direction opposite to the current flow, so that the silicon 21 that has been precipitated in the aluminum alloy electrode 20 in the vicinity of the interface with the tungsten electrode 4 is diffused into the aluminum alloy 5, which lowers the resistance of the unit cell Mc and hence enables the erasing of data.

The reading of data is performed using a sufficiently small current of $0.5 \times 10^5$ A/cm$^2$ or less so that it can be judged whether the data is "0" or "1" based on the magnitude of the resistance value of each unit cell Mc.

In the reading operation of the present embodiment also, variations in resistance value as a result of the reading operation can be avoided by providing a sufficient difference (ratio) (e.g., 100 to 1000 times or more) between the data write current and the data read current. In the case where the resistance value may vary during the reading operation for such a reason that the difference between the data write current and the data read current cannot be increased sufficiently, problems can be avoided by adding to the memory device such a refreshing function as performed in a DRAM. Moreover, even in the case where refreshing should be performed, stored data is retained if a power source is turned off, since it is non-volatile. Consequently, it is sufficient to perform refreshing when memory operation is unaffected (e.g., when the memory is not used or when another block in the memory is used). It is not necessary to perform refreshing simultaneously with reading, as is performed in a DRAM, so that the reading operation is not adversely affected.

The present embodiment has focused attention on the phenomenon that the silicon 21, which has been moved by the current flowing through the aluminum alloy electrode containing silicon in the direction opposite to the current flow, is precipitated in the aluminum alloy electrode 20 in the vicinity of the interface with the tungsten electrode 4 and has utilized, as a memory, such a characteristic that the resistance is increased by the precipitation of the silicon 21 in the aluminum alloy electrode 20 in the vicinity of the interface with the tungsten electrode 4. Since the high-state and low-state of the resistance are essentially non-volatile, they are retained even when the power source is turned off. Moreover, since the movement of the silicon is an irreversible process, as described above, data can be written in and erased from, i.e., rewritten in each individual unit cell Mc at any time in the memory device of the present embodiment. Hence, the memory device in the present embodiment functions as a non-volatile RAM.

Variations in resistance value caused by the current flowing through each of the unit cells are different depending on the diameter of the opening or on the materials of individual components. In the case where the aluminum electrode is used and the diameter of the opening is 0.6 μm, for example, the resistance value is varied from 0.2 Ω to 1.1 Ω by application of a current. In the case where the diameter of the opening is 0.2 μm, the resistance value is varied from 2 Ω to about 10 Ω by application of a current.

The speed at which the silicon 21 moves is dependent on temperature. The silicon is precipitated and diffused at a higher speed at a higher temperature. Therefore, the time required by writing and erasing operations can be reduced by heating the memory device to about 200° C. prior to the writing and erasing operations.

The memory device in the present embodiment is similar to a RAM in that data can be rewritten in each individual unit cell and that random access can be performed thereto. However, the memory device in the present embodiment has a functional advantage over the SRAM in that stored data is retained even when the power source is turned off, while it occupies an area much smaller than the area occupied by a DRAM which is further smaller than the area occupied by the SRAM. To be more specific, the unit cells functioning as memories have a width of about 0.5 μm and a pith of 1 μm in the present embodiment. If 0.35-μm design rules are adapted, however, the pitch of the unit cells can easily be reduced to about 0.7 µm. Compared with the DRAM in which the pitch is 1.7 to 1.9 µm in accordance with the 0.35-µm design rules, the memory device in the present embodiment occupies only about 30% of the area occupied by the DRAM. Hence, it can be concluded that the memory device according to the present embodiment is remarkably advantageous over the SRAM in terms of the function of retaining stored data and over a DRAM in terms of achieving higher integration.

In addition, since the memory device in the present embodiment is considerably simple in structure, it can be miniaturized in conjunction with prospective miniaturization of a semiconductor integrated circuit.

(Fifth Embodiment)

Figure 10A:
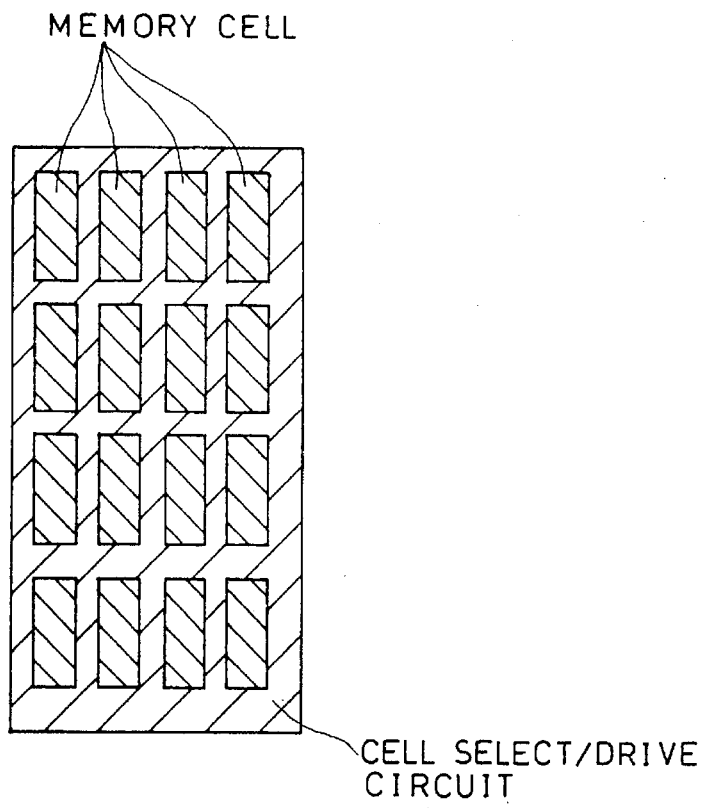
FIGS. 10(a) and 10(b) are plan views schematically showing the respective structures of the semiconductor integrated circuit according to the fifth embodiment and of a typical DRAM.
Figure 10B:
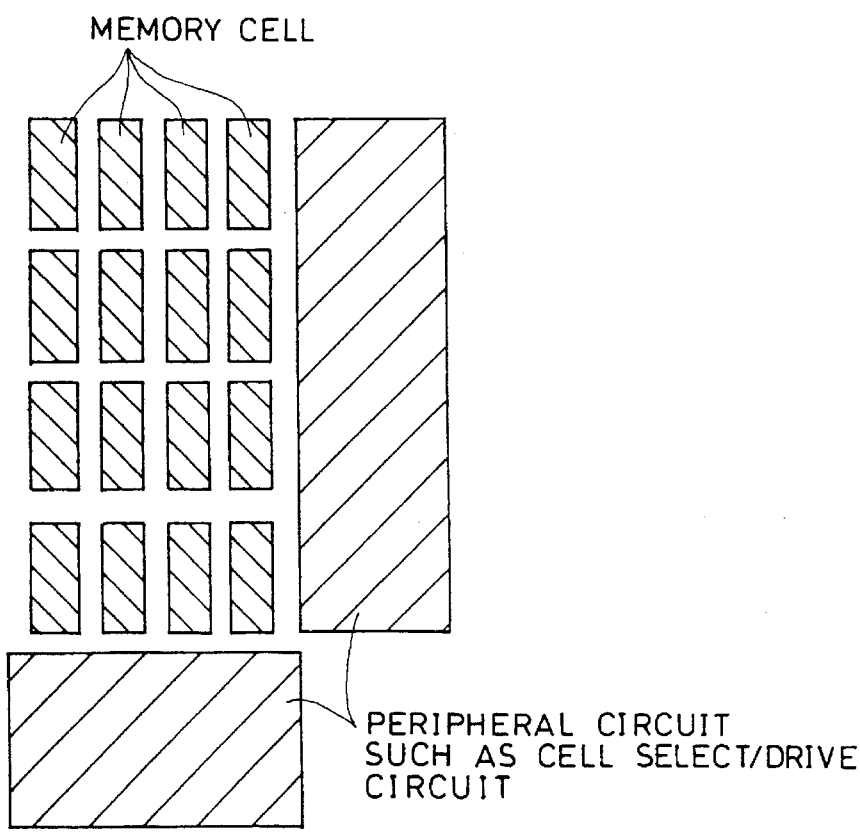

Below, a fifth embodiment will be described with reference to FIG. 9 and FIGS. 10(a) and 10(b). FIG. 9 is a cross-sectional view showing the structure of a semiconductor memory device in the present embodiment and FIG. 10(a) is a plan view showing the structure thereof. As shown in FIG. 9, the semiconductor memory device consists of a cell select/drive circuit region 50 and a memory cell region 60.

In the cell select/drive circuit region 50, active regions surrounded by an isolation 52 are formed on a semiconductor substrate 51. On the semiconductor substrate 51 in the active regions, respective Gate electrodes 53 are formed via Gate insulating films. Into these portions of the semiconductor substrate 51 located on both sides of the Gate electrodes 53 has been diffused an impurity for forming source/drain regions 54, so that MOS transistors are formed. The transistor in the present embodiment has a so-called LDD structure in which sidewalls are provided on the side faces of the gate electrode and the source/drain regions 54 consist of low-concentration source/drain regions and high-concentration source/drain regions. Over the substrate has been deposited an insulating layer 55 composed of a silicon dioxide film.

The memory cell region 60 in the present embodiment is formed on the insulating layer 55 and has the same structure as the memory device in the second embodiment described above. Specifically, the memory cell region 60 comprises: first aluminum interconnections 62 formed on the insulating layer 55; a silicon dioxide film 63 deposited over the entire surface of the substrate; tungsten electrodes 64, aluminum electrodes 65, and sidewalls 67 formed in the respective openings 8 formed in the silicon dioxide film 63; and second aluminum interconnections 66 formed over the silicon dioxide film 63 and aluminum electrodes 65.

The MOS transistors in the above cell select/drive circuit region 50 can be divided into two types depending on their functions: some of them serve as select transistors, while the others serve as drive transistors. The drain of the select transistor is in contact with a first plug 56 filled in a contact hole formed in the insulating layer 55, while the upper end of the plug 56 is in contact with the lower end of the first aluminum interconnection 52 in the memory cell region 60. The source of the select transistor is in contact with a bit line 57 indicated by the broken line in the drawing at a portion not shown in the cross section of FIG. 9. A word line extends in the direction orthogonal to the cross section of FIG. 9 over the isolation 52 and active region, while functioning as the gate electrode 53 in the individual active region. On the other hand, the source of the leftmost drive transistor in FIG. 9 is in contact with the second aluminum interconnection 66 of the memory cell region 60, while the drain thereof is in contact with a power-source terminal via the corresponding second plug 58.

FIG. 10(a) is a plan view diagrammatically showing the semiconductor memory device according to the present embodiment. FIG. 10(b) is a plan view diagrammatically showing the structure of a typical DRAM, which is provided for comparison with FIG. 10(a). Through the comparison between FIGS. 10(a) and 10(b), it will easily be understood that, since the cell select/drive circuit and memory cells can easily be formed in three dimensions in the semiconductor memory device of the present embodiment, the area occupied thereby can drastically be reduced compared with the area occupied by the typical DRAM in which a peripheral circuit is formed on both sides of memory cells.

(Sixth Embodiment)

Below, a sixth embodiment will be described with reference to FIGS. 11(a) to 11(d), which are cross-sectional views illustrating the process of manufacturing a semiconductor memory device according to the sixth embodiment.

Figure 11A:
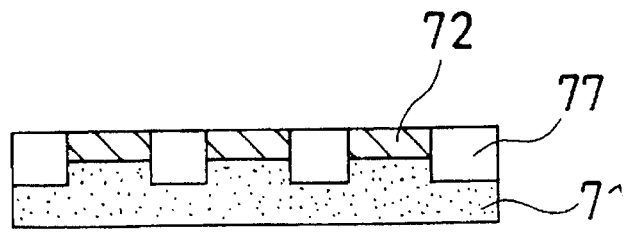
FIGS. 11(a) to 11(d) are cross-sectional views illustrating the process of manufacturing a semiconductor memory device according to a sixth embodiment.

Initially, as shown in FIG. 11(a), isolating oxide films 77 composed of a large number of linear silicon dioxide films extending in parallel to each other are formed on a silicon substrate 71. Into these portions of the silicon substrate 71 corresponding to the spaces between the adjacent isolating oxide films 77 are implanted phosphorus ions, thereby forming $n^+$ diffused layers 72 in stripes. After a titanium film is further formed over the $n^+$ diffused layers 72, the titanium is caused to react with the silicon in the $n^+$ diffused layers 72, thereby silicidizing the surfaces of the $n^+$ diffused layers 72. The silicidization can be performed by a well-known technique. The $n^+$ diffused layers 72 have a width of about 0.4 µm and a pitch of about 0.8 µm. The $n^+$ diffused layer 72 has the same function as the first aluminum interconnection in the above first embodiment and the like and forms a first conductive member.

Figure 11B:
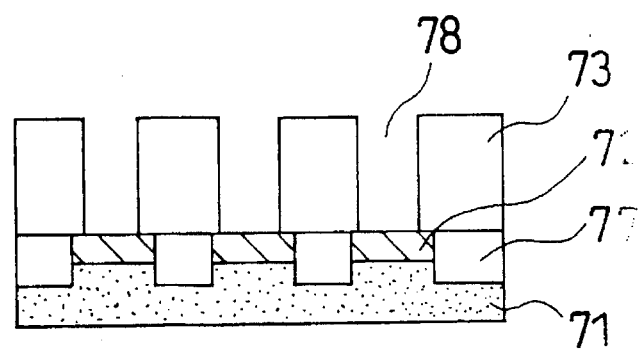

Next, as shown in FIG. 11(b), a silicon dioxide film 73 is deposited to a thickness of about 1 µm, parts of which are then selectively removed so that openings 78 leading to the respective $n^+$ diffused layers 72 are formed therein.

Figure 11C:
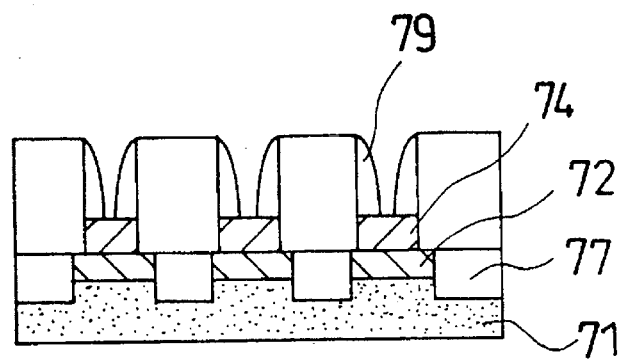

Next, as shown in FIG. 11(c), tungsten is deposited on the $n^+$ diffused layers 72 in the openings 78 by selective CVD, so as to form tungsten electrodes 74 having a thickness of about 500 nm. After a silicon dioxide film having a thickness of about ½ of the shortest side of the opening 78 is formed over the entire surface of the substrate, the silicon dioxide film is etched back so as to form sidewalls 79 on the side faces of the openings 78.

Figure 11D:
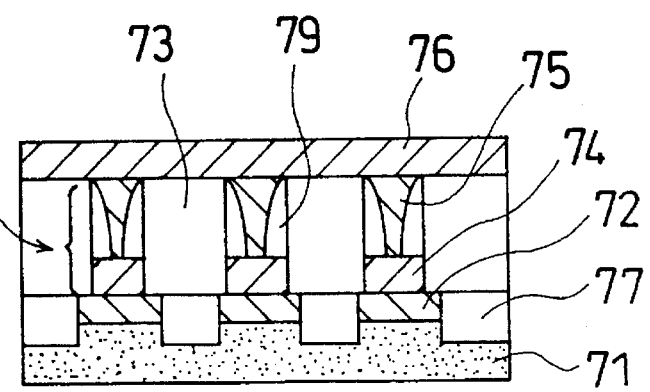

Next, as shown in FIG. 11(d), aluminum containing 0.5% to 20% of silicon is deposited on the tungsten electrodes 74 in the openings 78, so as to form aluminum electrodes 75 in the same method as described in the fourth embodiment. Thereafter, an aluminum film containing about 0.5% of silicon is deposited over the entire surface of the substrate and then patterned so as to form a large number of linear aluminum interconnections 76 which are connected to the respective aluminum electrodes 75 and extend in the direction orthogonal to the $n^+$ diffused layers 72.

Figure 12:
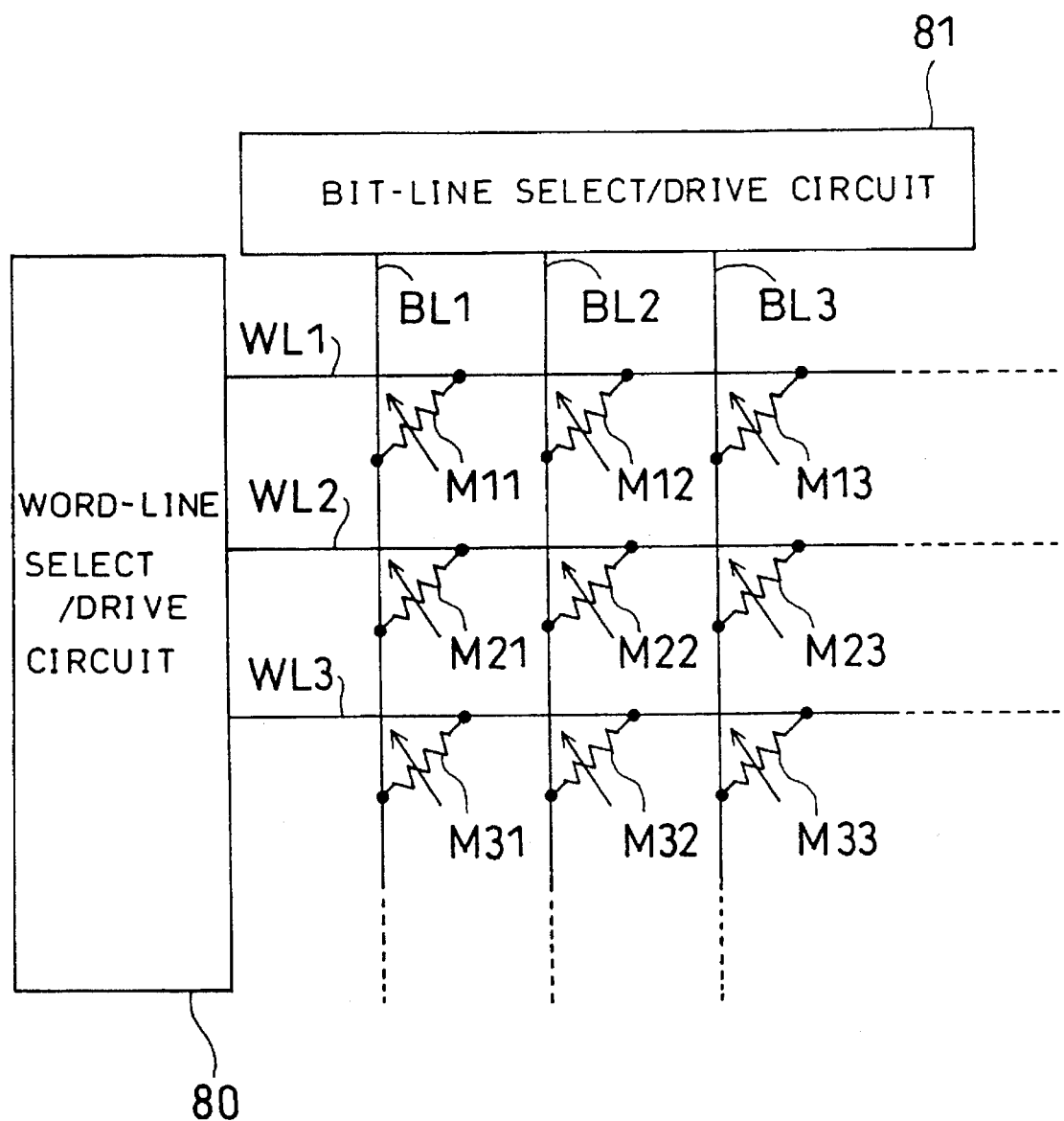
FIG. 12 is a circuit diagram of the semiconductor memory device according to the sixth embodiment.
Figure 13:
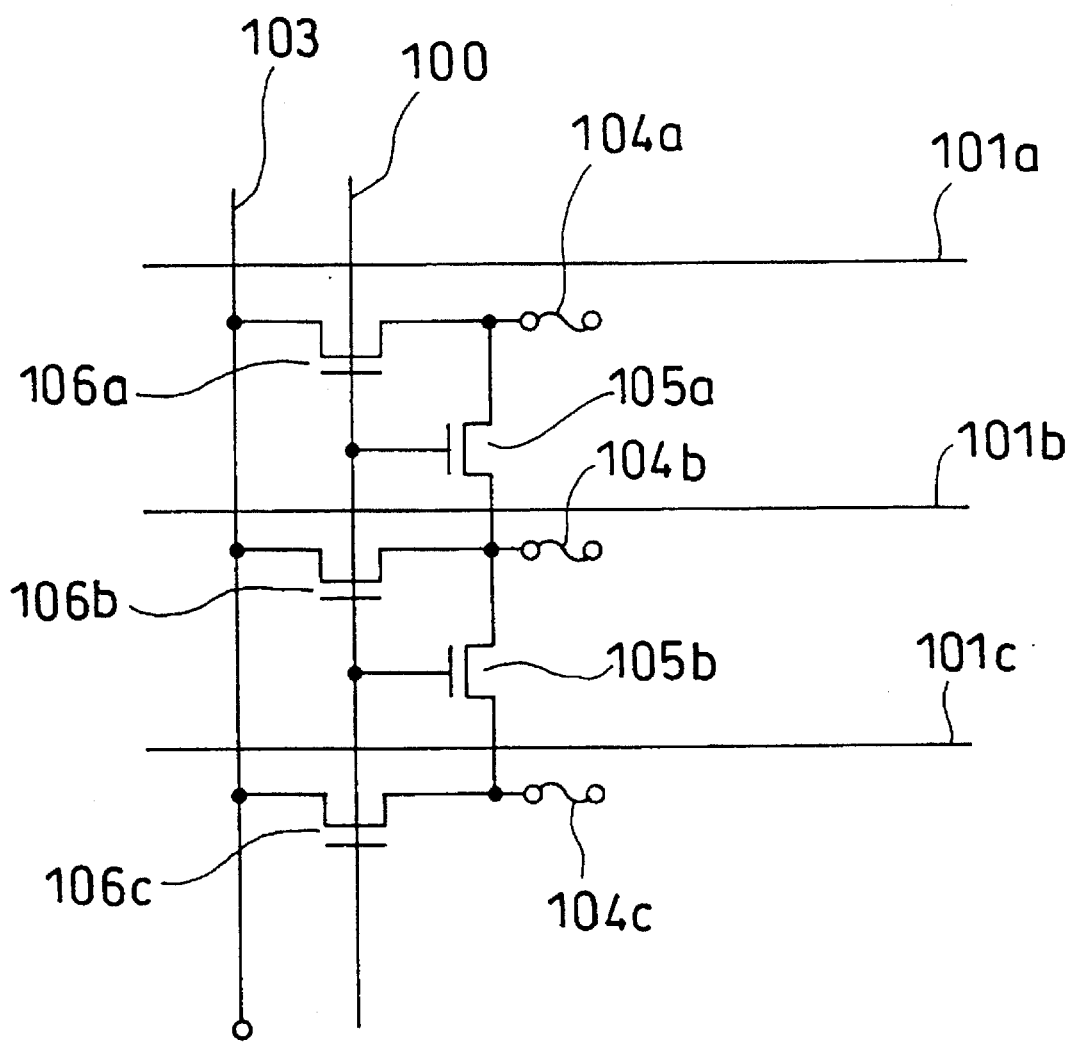
FIG. 13 is a circuit diagram of a conventional non-volatile memory using fuses.

FIG. 12 is a view schematically showing an electric circuit of the semiconductor memory device according to the present embodiment, wherein reference numerals 80 and 81 designate a word-line select/drive circuit and a bit-line select/drive circuit, respectively. From the word-line select/drive circuit 80 extend a large number of word lines WL1, WL2, WL3, . . . , while a large number of bit lines BL1, BL2, BL3, . . . extend from the bit-line select/drive circuit 81. At the individual intersections of the word lines WL1, WL2, WL3, . . . and the bit lines BL1, BL2, BL3, . . . are disposed a large number of memory cells M11, M12, . . . each having the same structure as the above unit cell Mc to form a matrix.

In the present embodiment, since each of the unit cells (memory cells) functioning as a memory consists of the tungsten electrode 74 and the aluminum electrode 75, the memory cell can be mounted directly on the semiconductor substrate. Moreover, the process of silicidizing the surfaces of the n$^+$diffused layers 72 functioning as interconnections can be performed by a typical salicide process for MOS transistors. Consequently, transistors in a peripheral circuit as well as memory cells utilizing the resistance varying characteristic can be mounted on a single semiconductor substrate, so that it becomes possible to easily fabricate a semiconductor memory device containing rewritable nonvolatile memory cells.

Instead of titanium silicide, tungsten silicide, cobalt silicide, nickel silicide, or the like may be formed on the surfaces of the n$^+$diffused layers 72. Although it is not necessarily required to silicidize the surfaces of the n$^+$diffused layers 72, the resistance of the n$^+$diffused layer 72 functioning as the interconnection can be reduced more remarkably by silicidizing the surface thereof than in the case where the n$^+$diffused layers are solely formed.

(Other Embodiments)

In the first to fifth embodiments, it is not necessarily required to form the tungsten electrodes. It is sufficient to form, for example, a tungsten film or a titanium film to a small thickness on the first aluminum interconnections, while forming only the aluminum electrodes in the entire openings. In this case, the sidewalls may be formed directly on the first aluminum interconnections in the second to sixth embodiments. In the third embodiment, the openings may be shifted in position from the first aluminum interconnections. In the sixth embodiment, the aluminum electrodes may be formed directly on the silicide layers so that the sidewalls are formed on the silicide layers.

It will be appreciated that the vertical positions of the aluminum electrode and tungsten electrode can be interchanged in each of the embodiments.

It will easily be understood from the description of the memory functions in each of the above embodiments that a tungsten plug may be interposed between the first aluminum interconnection and the second aluminum interconnection such that that portion of the first or second aluminum interconnection which is contiguous to the tungsten plug functions as a memory. In this case, that portion of the first or second aluminum interconnection which is located in the vicinity of the tungsten plug will form the resistance varying member according to the present invention.

An interconnection made of a material other than aluminum may be formed instead of the aluminum interconnection used in each of the above embodiments. It is not necessarily required to use aluminum as a material composing the resistance varying member. Any material can be used provided that it has such a resistance varying characteristic that its resistance varies due to the movement of the constituent atoms caused by application of a current.

We claim:

1. A memory device comprising:

a first conductive member;

a second conductive member provided to be opposed to said first conductive member; and a resistance varying member interposed between said first conductive member and said second conductive member, said resistance varying member having a resistance varying characteristic such that its resistance varies due to a movement of atoms which occurs when a current equal to or higher than a specified value is allowed to flow therethrough and a function of retaining a high-resistance state and a low-resistance state as data, wherein said data can be written in said resistance varying member by allowing a first current equal to or higher than said specified value to flow through said resistance varying member and said data can be read from said resistance varying member by allowing a second current lower than said specified value to flow through said resistance varying member.

2. A memory device according to claim 1, wherein said resistance varying member is composed of a material having the resistance varying characteristic such that its resistance varies as a result of the formation of a void in the vicinity of an end portion thereof due to the movement of the constituent atoms which is caused by the current equal to or higher than said specified value.

3. A memory device according to claim 2, wherein said resistance varying member is composed of substantially pure aluminum.

4. A memory device according to claim 3, wherein said first conductive member and said second conductive member are stacked in layers via an interlayer insulating film, said interlayer insulating film is formed with an opening connecting said first and second conductive members with each other, and said resistance varying member is an aluminum electrode stacked in layers in conjunction with a tungsten electrode in said opening.

5. A memory device according to claim 4, wherein a contact area between said aluminum electrode and said tungsten electrode is smaller than a contact area between said aluminum electrode and said first or second conductive member.

6. A memory device according to claim 1, wherein said data written in said resistance varying member can be erased therefrom by switching the high-resistance or low-resistance state of said resistance varying member to the opposite state by allowing a third current equal to or higher than said specified value to flow in a direction opposite to the flow of said first current through said resistance varying member via said first and second conductive members.

7. A memory device according to claim 6, wherein said resistance varying member is composed of a main material and an impurity and has the resistance varying characteristic such that its resistance varies due to the movement of the impurity in said main material which is caused by the current equal to or higher than said specified value.

8. A memory device according to claim 7, wherein said main material is aluminum and said aluminum contains 0.5% to 20% of silicon as said impurity.

9. A memory device according to claim 8, wherein said first conductive member and said second conductive member are stacked in layers via an interlayer insulating film, said interlayer insulating film is formed with an opening connecting said first and second conductive members with each other, and said resistance varying member is an aluminum alloy electrode stacked in layers in conjunction with a tungsten electrode in said opening.

10. A memory device according to claim 9, wherein a contact area between said aluminum alloy electrode and said tungsten electrode is smaller than a contact area between said aluminum alloy electrode and said first or second conductive member.

11. A memory device according to claim 1, wherein said first conductive member is composed of a plurality of first interconnections extending in parallel to each other, said second conductive member is composed of a plurality of second interconnections extending in a direction orthogonal to said respective first interconnections, and said resistance varying member is disposed at each of the intersections of said first interconnections and said second interconnections.

12. A memory device according to claim 11, further comprising:

a plurality of MOS transistors each consisting of a semiconductor substrate, a gate electrode, a source region, and a drain region; and a plurality of bit lines connected to the source regions of said respective MOS transistors, wherein said first conductive members are impurity diffusion layers formed by introducing an impurity into a plurality of linear regions of said semiconductor substrate, which has been partitioned by a plurality of isolating insulating films, and having their surfaces silicidized, said first conductive members are connected to the drain regions of said respective MOS transistors, and data can be written and read in and from that one of the resistance varying members selected via said gate electrode and said bit line of each of said MOS transistors.

13. A memory device according to claim 12, wherein said data written in said resistance varying member can be erased therefrom by switching the high-resistance or low-resistance state of said resistance varying member to the opposite state by allowing a third current equal to or higher than said specified value to flow in a direction opposite to the flow of said first current through said resistance varying member via said first and second conductive members and the data can be erased from the resistance varying member which has been selected via said gate electrode and said bit line of each of said MOS transistors and in which the data has been written.

14. A memory device according to claim 11, further comprising:

a plurality of MOS transistors each consisting of a semiconductor substrate, a gate electrode, a source region, and a drain region; and a plurality of bit lines connected to the source regions of said respective MOS transistors, wherein said first conductive members are formed over said respective MOS transistors via insulating films, said resistance varying members are connected to the drain regions of said respective MOS transistors via contacts formed in said insulating films, and data can be written and read in and from that one of the resistance varying members selected via said gate electrode and said bit line of each of said MOS transistors.

15. A memory device according to claim 14, wherein said data written in said resistance varying member can be erased therefrom by switching the high-resistance or low-resistance state of said resistance varying member to the opposite state by allowing a third current equal to or higher than said specified value to flow in a direction opposite to the flow of said first current through said resistance varying member via said first and second conductive members and the data can be erased from the resistance varying member which has been selected via said gate electrode and said bit line of each of said MOS transistors and in which the data has been written.

* * * * *